US007141800B2

(12) United States Patent
Kelly et al.

(10) Patent No.: US 7,141,800 B2
(45) Date of Patent: Nov. 28, 2006

(54) NON-DISPERSIVE CHARGED PARTICLE ENERGY ANALYZER

(75) Inventors: Michael A. Kelly, Portola Valley, CA (US); Charles E. Bryson, III, 19720 Quinn Ct., Morgan Hill, CA (US) 95037

(73) Assignee: Charles E. Bryson, III, Hollister, CA (US)

( * ) Notice: Subject to any disclaimer, the term of this patent is extended or adjusted under 35 U.S.C. 154(b) by 63 days.

(21) Appl. No.: 10/961,631

(22) Filed: Oct. 8, 2004

(65) Prior Publication Data

US 2005/0045832 A1 Mar. 3, 2005

Related U.S. Application Data

(63) Continuation-in-part of application No. 10/618,078, filed on Jul. 11, 2003, now Pat. No. 6,803,570.

(51) Int. Cl.
*H01J 3/26* (2006.01)
*H01J 49/48* (2006.01)

(52) U.S. Cl. .................. 250/397; 250/396 R; 250/305; 250/310; 250/306

(58) Field of Classification Search ................ 250/397, 250/396 R

See application file for complete search history.

(56) References Cited

U.S. PATENT DOCUMENTS 3,935,454 A * 1/1976 Lee ............................ 250/305
4,546,254 A * 10/1985 Yamauchi ................... 250/305

FOREIGN PATENT DOCUMENTS

JP 58078361 * 5/1983
JP 60101852 * 6/1985 ................. 250/305
JP 62226554 * 10/1987 ............. 250/396 R
JP 62229750 * 10/1987

OTHER PUBLICATIONS

Angle Resolved Electron Spectrpmeter With Large Angle Visual Display. Nov. 1979. IBM Technical Disclosure Bulletin, Nov. 1979, US vol. No. 22, pp. 2561-2562.*

J. D. Lee, "A nondispersive electron energy analyzer for ESCA", *Rev. Sci. Instrum.*, vol. 44, No. 7, Jul. 1973, 893-898 pp.

I. Tepermeister et al., "Modeling and construction of a novel electron energy analyzer for rapid x-ray photoelectron spectroscopy spectra acquisition", *Rev. Sci. Instrum.*, vol. 63, No. 8, Aug. 1992, 3828-3834 pp.

* cited by examiner

*Primary Examiner*—Nikita Wells
*Assistant Examiner*—James J. Leybourne
(74) *Attorney, Agent, or Firm*—Charles S. Guenzer

(57) ABSTRACT

An electron energy analyzer including a curved electrostatic low-pass reflector and a high-pass electrostatic transmissive filter. The reflector comprises a curved grid, preferably ellipsoidal, and an absorber electrode placed in back of the curved grid with respect to the electron source and biased negatively to the curved grid to act as a reflective low-pass filter and a collimating optics for the reflected beam. The transmissive filter includes first and second flat grids extending across the collimated reflected beam. The second grid on the side of the first grid opposite the curved grid is biased negatively to the first grid and the absorber electrode. A field free region is created by applying the same bias to the curved grid, the first grid, and chamber sidewall sleeve. An electron detector detects all electrons passed by the second grid in an energy band in the overlap of the high-pass and low-pass bands.

23 Claims, 3 Drawing Sheets

UHV PUMP
$V_1$
$V_2$
$V_3$
e-

*Fig. 2*
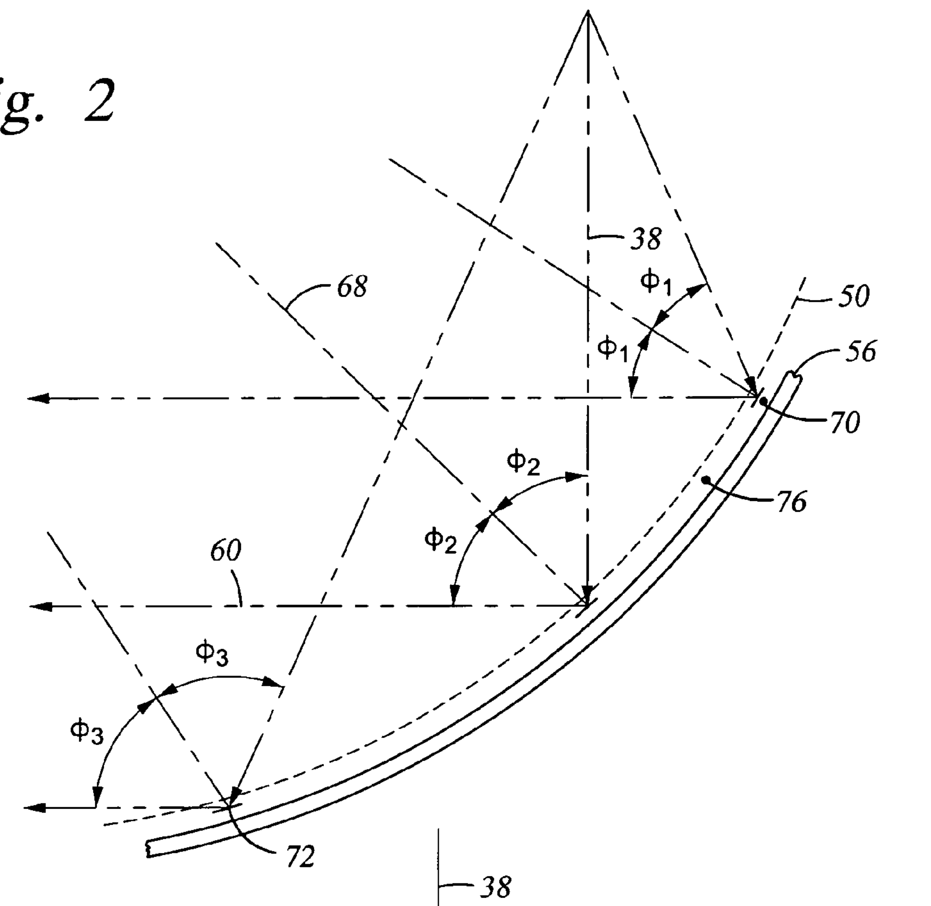
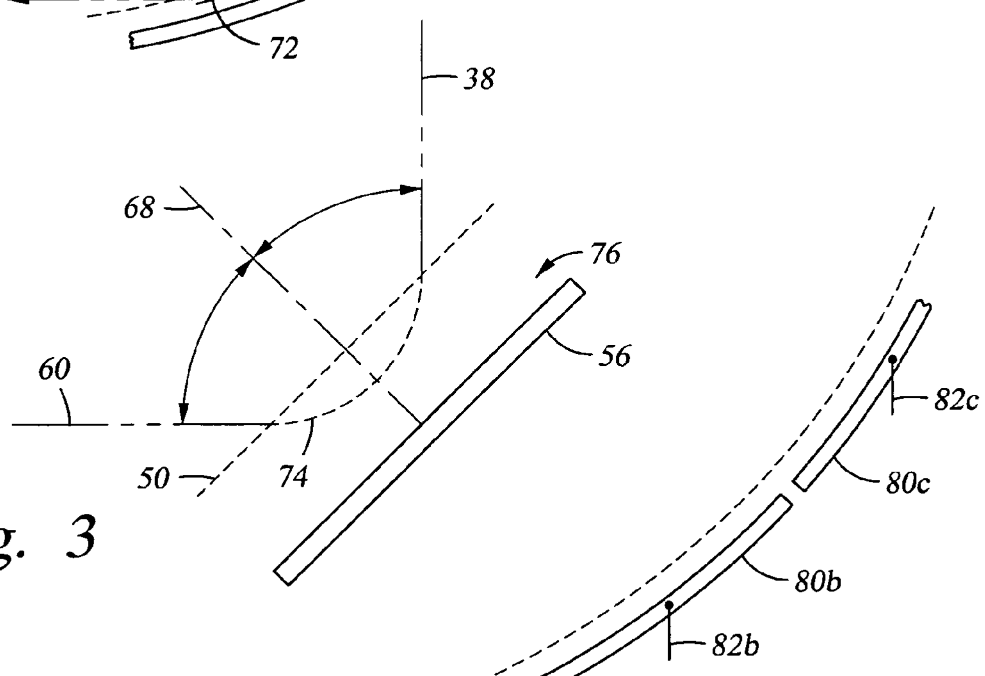
*Fig. 3*
*Fig. 4*

NON-DISPERSIVE CHARGED PARTICLE ENERGY ANALYZER

RELATED APPLICATION

This application is a continuation in part of Ser. No. 10/618,078, filed Jul. 11, 2003 and scheduled to issue on Oct. 12, 2004 as U.S. Pat. No. 6,803,570.

BACKGROUND OF THE INVENTION

1. Field of the Invention

The invention relates generally to analyzers for charged particle beams. In particular, the invention relates to energy analyzers of electrons or other charged particles.

2. Background Art

The parent application Ser. No. 10/618,078, incorporated herein by reference in its entirety, describes a spectrometer in which the energy of secondary electrons is measured in the range of a few electron volts (eV) to a few keV. There are many types of such spectrometers used for characterizing the composition and other properties of materials in which the electron energy needs to be measured, for example, X-ray photoelectron spectrometers and electron spectrometers, and secondary ion spectrometers. Similar spectroscopes, such as secondary ion spectrometers, have been applied to other charged particles, such as energetic ions. Many scientific experiments require accurate measurement of the energy distribution of charged particles. The parent application was principally directed to a vacuum window usable on electron spectrometers that is transmissive to such low-energy electrons. In contrast, the present application is principally directed to the charged particle electrostatic optics used in a charged particle energy analyzer to discriminate the energy of charged particles and to measure their intensity or flux.

The performance of a charged particle energy analyzer, of which an electron energy analyzer is but one example but the most prevalent example, is gauged by several conflicting characteristics. It needs to have a narrow resolution over a reasonably large energy band and the selected energy should be easily tuned. Its resolution needs to be stable and not require repeated calibration. The energy analyzer needs to have a high detection efficiency, which results in a high throughput of analyzed samples. Of especial importance in material characterization in which secondary electrons or ions are emitted over a wide angle from the material being probed, the energy analyzer should have a wide aperture and a wide acceptance angle to thereby increase the collection efficiency. A typical requirement of a commercial electron energy analyzer is that it be able to analyze 10 to 20% of the electrons emitted from the material and to distinguish electrons whose energies differ by as little as 0.1%.

Commercial energy analyzers should be rugged, small, easy to operate, and relatively inexpensive. If these commercial characteristics can be improved, materials analysis equipment can more readily find acceptance in production environments, such as in-line processing monitors in the semiconductor industry. Such characteristics are also important for remote operation, such as the search for life on Mars. For space applications, an energy analyzer needs to be lightweight, a characteristic also desired for other applications.

Several types of charged particle energy analyzers are common. Dispersive analyzers are the most common. They depend upon electric or magnetic fields to spatially deflect a well defined beam of charged particles. The amount of spatial deflection depends upon the energy (velocity) of the charged particle. A detector positioned at a particular offset from the original beam direction detects only the charged particles of an energy associated with the position. Either the detector position or the electric or magnetic field can be varied to measure an energy spectrum. Dispersive analyzers can be made designed with very high resolution. However, dispersive electron energy analyzers tend to be large and heavy, having a diameter of 1 m and a volume of 0.5 $m^3$. In addition, they generally have a limited spatial and angular acceptance for electrons coming from a material surface. Their throughputs are generally low so they are more suited for a scientific experiment than for a industrial application.

Non-dispersive analyzers, on the other hand, rely upon high-pass and low-pass energy filters to allow only charged particles in an energy band to reach the detector. Non-dispersive electron analyzers have larger throughputs and tend to be smaller than dispersive electron analyzers. However, their energy resolution and stability have limited their use.

An early analyzer which incorporates both dispersive and non-dispersive sections is described by in "A nondispersive electron energy analyzer for ESCA," *Review of Scientific Instrumentation*, vol 44, no. 7, July 1973, pp. 893–898. In it, charged particles are injected along the axis of a cylindrical chamber using a dispersive filter that eliminates very high and very low energy charged particles. In the chamber, a reflective low-pass filter is followed by a high-pass filter to select a range of energies that reach a detector. This analyzer has been used commercially in surface analysis instruments manufactured by the duPont Company and later by Shimatsu Inc. It has a higher throughput than similarly sized dispersive analyzers, but considerably less than that theoretically possible in a completely nondispersive analyzer.

A more recent nondispersive analyzer is described by Tepermeister et al. in "Modeling and construction of a novel electron energy analyzer for rapid x-ray photoelectron spectroscopy spectra acquisition," *Review of Scientific Instrumentation*, vol. 63, no. 8, August 1992, pp. 3828–3834. The Tepermeister analyzer includes a high-pass filter followed by a lens which acts as a low-pass filter. It also has a high throughput, but the collection efficiency of the analyzer must be compromised considerably to achieve good energy resolution.

It is thus desired to provide a light and compact charged particle analyzer with high collection efficiency.

SUMMARY OF THE INVENTION

A charged particle energy analyzer includes an electrostatic low-pass filter and an electrostatic filter in which the overlap of the two filter pass bands defines the pass band of the analyzer. The charged particles may be electrons or ions.

A curved reflector acts as both the low-pass filter and collimating optics. The reflector is preferably elliptically shaped in two-dimensions, that is, ellipsoidal. The reflector includes a curved grid facing the source of charged particles and an absorber electrode at the back of the curved grid and separated from it by a gap, preferably of constant thickness. A voltage applied between the curved grid and the absorber electrode determines which particles are reflected from the reflector along a chamber axis into a substantially field-free region. Charged particles with enough energy to reach the absorber electrode will not be reflected.

The field-free region is defined by the curved grid, a chamber sidewall surrounding the chamber axis, and a first grid, preferably flat and perpendicular to the chamber axis, all being held at the same voltage.

A second grid, which is preferably flat, is positioned in back of the first grid and is biased with respect to first grid to pass only higher energy charged particles received from the reflector.

A charged particle detector, preferably biased with respect to the second grid to attract the charged particles passed by the second grid, measures the number of charged particles in the pass band of the analyzer.

The absorber electrode may advantageously be segmented with differential bias voltages applied across the segments to account for the variation of incidence angles of charged particles received from the charged particle source so that each segment reflects particles with substantially the same energy threshold.

BRIEF DESCRIPTION OF THE DRAWINGS

FIG. 2 is a schematic view illustrating the variation of incidence angle along the curved reflector.

FIG. 3 is a schematic view illustrated the electron trajectory within the low-pass reflector.

FIG. 4 is a cross-sectional view of curved reflector with a segmented absorber electrode.

DETAILED DESCRIPTION OF THE PREFERRED EMBODIMENTS

Figure 1:
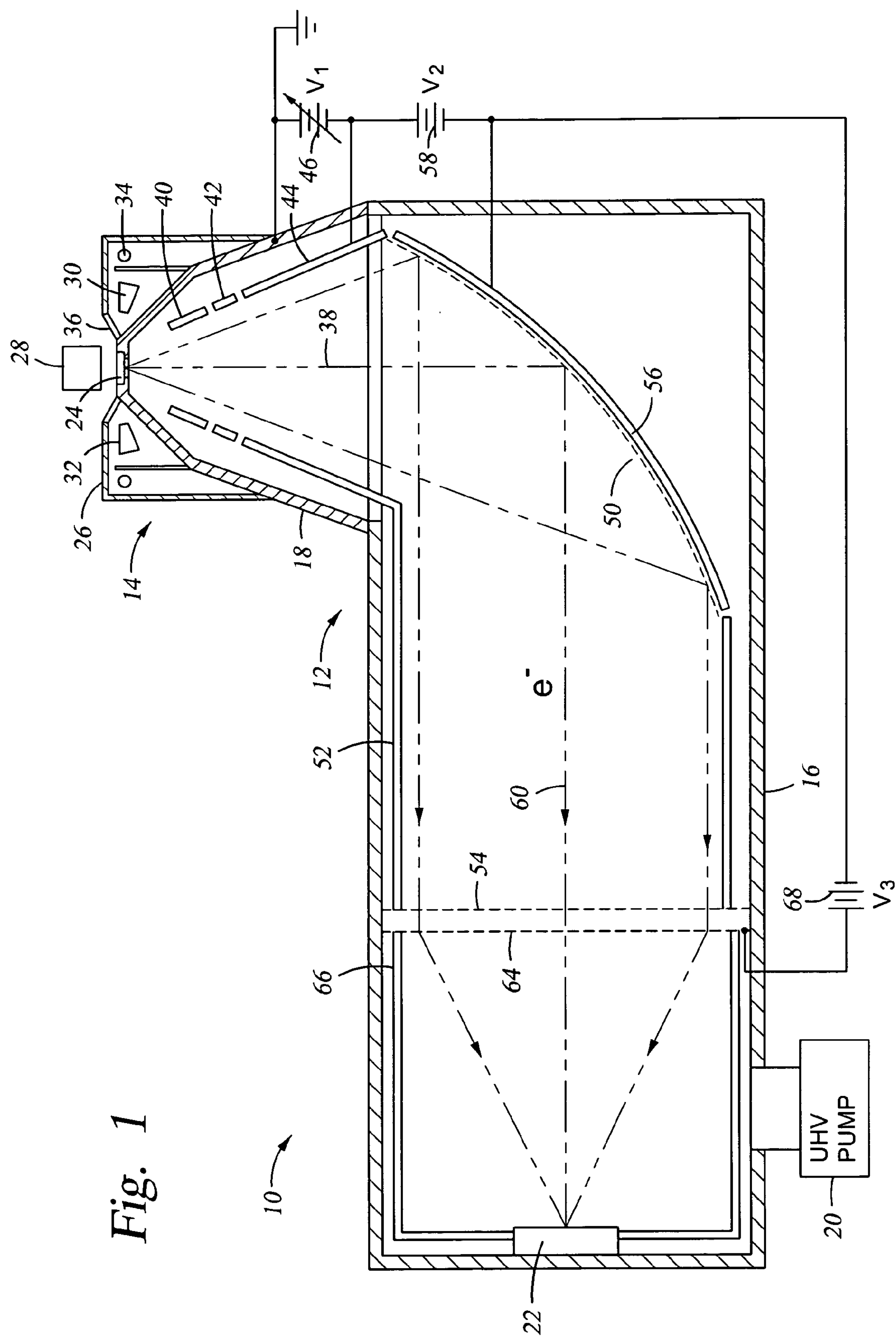
FIG. 1 is a cross-sectional view of a compact X-ray photoelectron spectrometer using a first embodiment of an electron energy analyzer of the invention.

A compact X-ray photoelectron spectrometer (XPS) 10, illustrated in cross section in FIG. 1, includes a compact and rugged electron energy analyzer 12 of the invention and an electron source 14. The energy analyzer 12 includes a tubular main chamber 16 extending along a main chamber axis and having a diameter of about 10 cm and a generally conically shaped side chamber 18 extending along a source axis inclined to the main chamber axis and disposed at one end of the main chamber 16. The side chamber 18 supports the electron source 14. Both the main chamber 16 and the side chamber 18 are vacuum pumped to UHV pressure by a vacuum pump system 20 sufficiently low that the mean free path of the electrons being measured is significantly longer than the total path length within the two chambers 16, 18. It is assumed that both chambers 16, 18 are conductive and electrically grounded. An electron detector 22, such as a microchannel plate or photomultiplier tube, is disposed on the other end of the tubular chamber 16 opposite the electron source 14, and its electrical output measures the intensity or flux of the electrons being detected.

The structure of the electron source 14, which is not central to the present invention, depends on the particular type of spectrometer being implemented. For the X-ray photoelectron spectrometer of one embodiment of the parent application, the electron source 14 includes an ultra-thin vacuum window 24 having a size generally defining the entrance aperture to the energy analyzer 12. The exterior of the window 24 is recessed from a face 26 fixed to the side chamber 18, which may act as a table top for the spectrometer 10. A sample 28 is positioned closely adjacent the vacuum window 24. For Martian applications, the Martian atmosphere of 7 Torr is sufficiently low to allow the sample 28 to be remain within the Martian atmosphere if placed within a few millimeters of the window 24. For terrestrial applications, the sample 28 may be enclosed in a secondary vacuum chamber sealed to the face 26 and pumped to a few Torr or preferably milliTorr. Advantageously, the secondary vacuum chamber may be backfilled at these pressures with a selected gaseous environment to allow investigation of gas phase kinetics on the sample surface. That is, the secondary vacuum chamber acts as a low-pressure gas cell. An annular x-ray source includes an annular target 30 with an oblique face 32 strongly biased with respect to a probe electron source 34 to attract and accelerate electrons to the oblique face 32 to excite the target 30 to emit x-rays towards portions of the sample 28 facing the electron vacuum window 24. The x-ray source is positioned around and below the vacuum window 24 and irradiates the sample 28 through a relatively thin X-ray window 36 with sufficient transmission for the x-ray wavelength of interest.

The X-rays interact with the surface of the sample 28 and photoelectrons are emitted in an electron beam 38 from the sample 28 over a relatively wide angle. These photoelectrons, whose energies provides information about the composition and chemical bonding of the sample 28, enter the electron energy analyzer 12 through the electron window 24. Other types of spectrometers produce secondary electrons by different mechanisms and the secondary electrons require energy analysis. For many analyzer applications, a vacuum window is not required so that a conductive metal mesh through which the second electrons can pass may replace the ultra thin window 24.

A series of conically shaped electrostatic retarder lenses 40, 42, 44 arranged around the beam 38 within the side chamber 18 are applied with different magnitudes of voltage to direct the electrons to the absorbing electrode 56 and to retard them and decrease their energy. Only the biasing of the final retarder lens 44 is illustrated by a voltage source 46 producing a selectable negative voltage $V_1$ with respect to the grounded chambers 16, 18. For example, −900V of bias to the final retarder lens 44 reduces a 1000 eV electron to an energy of 100 eV and a 901 eV electron to 1 eV. If the electron has an energy of less than $eV_1$, ignoring the negative polarity of the voltage, the retarder lenses 40, 42, 44 repel the low-energy electron back towards the electron source 14, where it is likely absorbed by the grounded side chamber 18.

The interior of the main chamber 16 is lined, except for an entrance to the side chamber 14 by a curved grid 50, a conductive tubular sleeve electrode 52 adjacent the walls of the main chamber 16, and a first flat grid 54 on the end of the main chamber facing the electron detector 22 and perpendicular to the main chamber axis to create an essentially field-free region for electrons which have passed the final retarder lens 44. The curved grid 50, the sleeve electrode 52, and the flat grid 54 are all electrically connected to the final retarder lens 44 and are biased to the same potential $V_1$. Thereby, the retarded electrons having exemplary energies of 100 eV and above enter a field free region in the main chamber 16.

A curved absorber electrode 56 is placed in back of the curved grid 50. A second DC power supply 58 negatively biases the absorber electrode 56 with respect to the curved grid 50 by a voltage $V_2$. The electrons mostly pass through the curved grid 50 and enter a repulsive field region created by the biased absorber electrode 56, which repels and thus reflects any electron having an energy of less then $e(V_1+\alpha V_2)$, ignoring the negative polarity of the voltages, where $\alpha$ is a geometric factor to be discussed later which is associated with the incidence angle. The reflected electron is accelerated back to the curved grid 50 and passes through it with substantially the same energy as it had in the field-free region. However, all electrons having an energy of more than $e(V_1+\alpha V_2)$ strike the absorber electrode 56 and are absorbed by it. As a result, the curved grid 50 and absorber electrode 56 act as a reflective low-pass filter which reflects electrons back into the field-free region having an energy of less than $e(V_1+\alpha V_2)$ and absorbs electrons having greater energy. However, since the retarding lenses 40, 42, 44 had already removed electrons having energies less than $V_1$, a reflected beam 60 contains electrons originally having energies only between $V_1$ and $V_2$. If $V_2$=−100V and $V_1$=−900V, then the reflected beam contains electrons originally having energies between 900 eV and $\alpha\times1000$ eV. Note that the lower energy should be corrected by a geometric factor to be introduced later relating to the angle of incidence.

In one embodiment, the gap between the curved grid 50 and the curved absorber electrode 56 is substantially constant and both the curved grid 50 and absorber electrode 56 are elliptically shaped, preferably in two dimensions to be ellipsoidal, with a focus at or closely adjacent to the electron source 28 so that the electrons emanating from the point electron source in a generally conically shaped beam are reflected by the absorber electrode 56 as the substantially collimated reflected beam 60 extending parallel to an axis of the tubular main chamber 16 and sleeve electrode 52. It is possible that a curved first grid may be combined with a non-ellipsoidally shaped curved grid 50 and absorber electrode 56, perhaps of different shapes between them, to achieve focusing the beam from a point electron source to strike the curved first grid at normal angles. In the extreme, the low-pass grid 50 may be flat and the high-pass grid 54 may be shaped, for example, approximately ellipsoidal, so that the incident electrons strike the grid 54 at normal angles.

The reflected electrons in the collimated beam 60 pass through the first flat grid 54 arranged transversely to the main chamber axis in opposition to the reflector formed by the curved grid 50 and absorber electrode 56. A second flat grid 64 is disposed between the first flat grid 64 and the electron detector 22. The two flat grids 54, 64 extend across and are supported on the tubular housing 16 but are electrically isolated from it. A can electrode 66 is electrically connected to the second flat grid 64 and is spaced apart from the sidewalls 16 of the chamber 16 and its end wall except in the area of the electron detector 22 to create a substantially field-free region between the second flat grid 64 and the electron detector 22. Thereby, any electron passing the second flat grid 66 feels only the electrostatic attraction of the typically electrically biased detector 22. The sleeve and can electrodes 52, 66 may be metallic tubes or cylindrically shaped screens of sufficient density to establish an electrical potential on their interior.

A third DC voltage supply 68 biases the second flat grid 64 and the can electrode 66 to a negative voltage of somewhat less magnitude than the voltage on the absorber electrode 58, the difference determining the resolution of the energy analyzer. If the third power supply 68 is connected between the absorber electrode 56 and the second flat electrode 64, it biases the second flat grid 64 with a positive voltage $V_3$ with respect to the negative voltage $(V_1+V_2)$ on the absorber electrode 56. With the illustrated polarities, the negative voltage on the second flat grid 64 is $(-|V_1+V_2|+V_3)$. The second flat grid 64 then passes electrons having energies greater than $e(V_1+\alpha V_2-V_3)$, ignoring the polarities on the power supplies and reflects electrons having less energies, and these electrons are detected by the electron detector 22.

As a result, the second flat grid 64 acts as a transmissive high-pass filter. However, since the absorbing electrode 56 had already removed electrons with energies greater than 1000 eV, the electrons passing the second flat grid 64 have original energies between 999 eV and 1000 eV. The reflected electrons will strike the electrodes around the field free region or return to the sample and replace some of those that were emitted from there.

The electron detector 22 is biased positively with respect to the second flat grid 64 and the can electrode 66 so that the electrons passing the second flat grid 64 are drawn to and focused on the electron detector. The actual energies of the electrons passing the second flat grid 64 are no more than the resolution of the analyzer. As a result, positive bias of a few volts, for example, between 10 and 20V, on the electron detector 22 will attract the electrons away from the second flat grid 64 and can electrode 66 and focus them on the electron detector 22 and provide them sufficient energy to interact with the electron detector 22.

Any of the power supplies 46, 58, 68 can be tuned to change the bandpass of combination of the high-pass and low-pass filters. However, varying $V_3$ on the third power supply 68 will change the energy resolution. Varying $V_2$ on the second power supply 58 will shift the pass bands on both the high-pass and low-pass filters. However, as will be described below, the electron transport in the gap between the curved grid 50 and the absorbing electrode 56 is somewhat complicated and it preferable to not vary the voltage between them. Instead, it is preferred to vary $V_1$ on the first power supply 46 to control the minimum energy of electrons entering the field free region. Thereby, varying $V_1$ while continuing to monitor the current from the electron detector will provide an energy spectrum of the source electrons.

The curved reflector, preferably ellipsoidally shaped (elliptical, paraboloidal and parabolic shapes provide some of the beneficial results) allows the collection of source electrons over a large solid angle and the resultant collimated reflected beam allows the final high-pass filter to have an improved energy resolution.

The operation of the electrostatic reflector described above is overly simplified and assumes that the source electrons are incident on the reflector at a perpendicular angle to the reflector surface. Instead, as is apparent from the exploded view of FIG. 2, the source electrons in the incident beam 38 strike the electrostatic reflector at finite angles from a local normal 68 that is perpendicular to the surface of the curved grid 50 at the position the source electron strikes. The angles range from a somewhat acute angle $\phi_1$ at a position 70 the end of the reflector elements 50 nearest the electron source 14 to a substantially larger oblique angle $\phi_3$ at a position 72 near the opposite end. The reflector reflects the low-pass filtered elements into the collimated beam 60 with the individual parallel components being reflected at the same angles $\phi_1$, $\phi_2$, $\phi_3$ with respect to the local normals 68. Furthermore, when the source electrons in the incident beam 38 enter the reflector structure at an angle $\phi$ with respect to a local normal 68, the source electrons follow a quadratic trajectory 74, illustrated in the exploded local view of FIG. 3, in a gap 76 between the curved grid 50 and the absorber electrode 70. The incident source electron has a kinetic energy E, which can be decomposed into a normal component $E\cos^2\phi$ along the local normal 68 and a parallel component $E\sin^2\phi$ that is parallel to the local surface of the reflector. These components can alternatively be expressed as the square of the velocity components in these same two directions. Within the approximation that the size of the gap 76 is smaller than the curvature of the curved reflector elements 50, 56, the electrostatic repulsion of the absorber electrode 56 affects only the normal component. The absorber electrode 56 does not affect the parallel component. An electron having a normal component E $\cos^2 \phi$ that is greater than the eV, V being the voltage difference between the curved grid 50 and the more negatively biased absorber electrode 56 will strike the absorber electrode 56 and be absorbed by it. Hence, the voltage on the absorber electrode 56 discriminates against the normal energy component E $\cos^2 \phi$ and not the total energy E. As a result, the magnitude of the voltage on the absorber electrode 56 relative to the curved grid 50 needs to be decreased to include the geometric factor $\cos^2 \phi$, which is inversely related to the previously mentioned $\alpha$. As a result, the voltage $V_3$ on the second flat grid does not equal the energy resolution but additionally contains a voltage corresponding to the parallel energy.

However, the situation is worsened by the change of incidence angle $\phi$ along the curved reflector. Different energies are being filtered at different points along the curved reflector. This situation can be alleviated, as illustrated in the schematic cross-sectional view of FIG. 4, by dividing the absorber electrode 56 into a plurality of curved absorber electrode segments 80*a*, 80*b*, 80*c* having the same total shape as the single absorber electrode 56 but electrically isolated from each other and separately biased by respective terminals 82*a*, 82*b*, 80*c* so that different geometric factors can be accounted for in biasing the different electrode segments 80*a*, 80*b*, 80*c* dependent upon the local incidence angle $\phi$. Although three electrode segments are illustrated, improved filtering is achieved with even two electrode segments, and more than three electrode segments offer further improved filtering. There are other method of establishing a voltage gradient along the absorber electrode, such as a resistor chain or using the electrode itself as the resistor.

Although the electron analyzer 12 was described in the context of an XPS spectrometer 10, relatively small changes convert it to an AES analyzer in which the multi-keV probe electrons are injected through the main electron vacuum window 24 or through a similar window positioned on the side. Other types of spectrometers may utilize the electron analyzer of the invention. Although the electron window 24 is advantageous for lightweight and flexibly used equipment, it is not required of the invention so that the electron source 14 may be included with the UHV environment of the main chamber 16.

Simulations indicate that the electron analyzer 12 of the invention is capable of a band pass of 0.8 eV for 1000 eV electrons.

Although the side position of the electron source simplifies the operation of the spectrometer, the geometry complicates the electrostatic optics, particularly the low-pass reflector. An alternative spectrometer 90, illustrated in the schematic cross-sectional view of FIG. 5, places an electron source 92 along the main chamber axis of the tubular main chamber 16 within the field-free region. The electron source 92 may be disposed within a sample finger projecting into the field-free region from the sidewall of main chamber 16 to allow samples to be easily changed, as has been explained in the parent application. The electron source 92 may include internal conically shaped retarder lenses to reduce the energy of the electrons entering the energy analyzer. Electric fields inevitably develop near the electron source 92 but can be minimized by biasing most of exterior surface of the electron source 92 at the same potential as the curved grid 50, the tubular sleeve 52, and the first flat grid 54. The unillustrated biasing follows that of FIG. 1.

In this embodiment, the curved grid 50 and the absorber electrode 56 preferably are ellipsoidally shaped symmetrically about the main chamber axis (although again elliptical, parabolic, ellipsoidal shapes often some advantages) so that the arc-shaped incident beam 38 is reflected after filtering into the collimated beam 60. The electron source 92 and its sample finger interfere with a portion of the reflected beam 34. This problem can be lessened by forming the portion of the curved grid 50 that is blocked by the electron source 92 as a solid electrode to absorb those source electrons regardless of energy.

Figure 5:
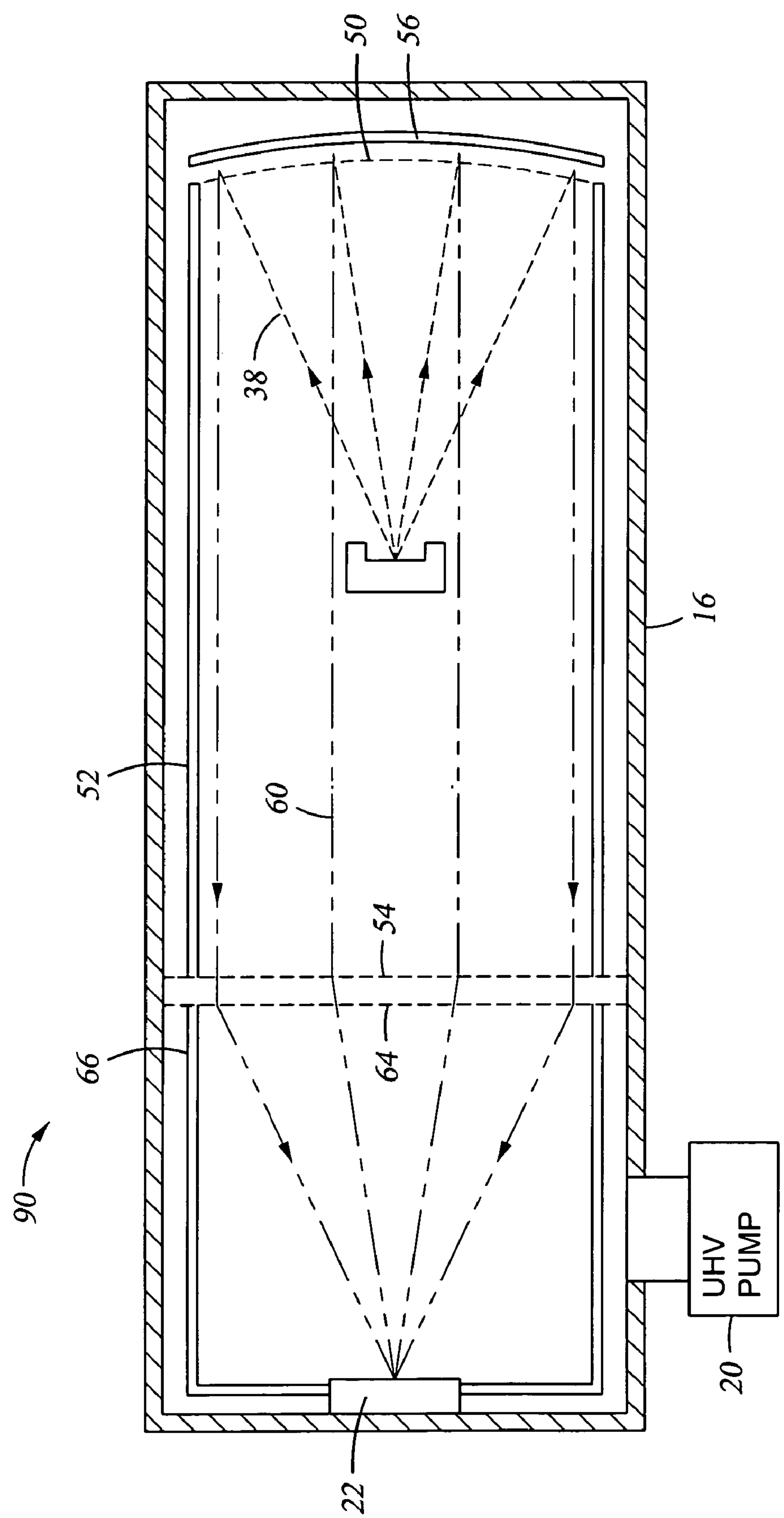
FIG. 5 is cross-sectional view of a spectrometer using a second embodiment of an electron energy analyzer of the invention.

Although the spectrometer 90 of FIG. 5 imposes more operational constraints than the spectrometer 10 of FIG. 1, its electrostatic reflector is subject to much reduced geometric factors and thus is expected to provide better energy resolution.

The energy analyzer of the invention may also be applied to ionic energy analyzers in which the source provides energetic ions, preferably of known mass and charge state, for example hydrogen ions, that is, protons. Of course, the biasing polarity needs to be reversed for positively charged ions and the reflector optics must account for the larger ion mass.

Accordingly, the invention provides a small and lightweight charged particle analyzer capable of high throughput and good resolution.

The invention claimed is:

1. A charged particle analyzer, comprising:

a reflector comprising a curved grid and at least one curved electrode positioned on a back side of said curved grid and separated therefrom by a gap, a source of charged particles being positioned on a front side of said curved grid;

a conductive sidewall extending along and surrounding a chamber axis and held at a same potential as said curved grid;

a first grid arranged substantially transversely to said chamber axis and held at the same potential as said curved grid and having a front side facing said curved grid along said chamber axis;

a second grid arranged on a back side of a first grid; and a charged particle detector positioned on a side of said second grid opposite said first grid.

2. The analyzer of claim 1, wherein said reflector is capable of producing from charged particles received from said source a beam of said charged particles that is substantially collimated along a chamber axis.

3. The analyzer of claim 1, wherein said curved grid is curved about a focus located at said source.

4. The analyzer of claim 1, wherein said curved reflector is elliptically shaped in at least one dimension.

5. The analyzer of claim 3 wherein said curved reflector is ellipsoidally shaped.

6. The analyzer of claim 1, wherein said charged particle source is a source of electrons.

7. The analyzer of claim 1, wherein said source is disposed along said axis.

8. The analyzer of claim 1 wherein said source is disposed not on said chamber axis.

9. The analyzer of claim 8, wherein said source emits said charged particles in an angular beam centered on a source axis that is inclined towards said chamber axis.

10. The analyzer of claim 1, wherein said sidewall is tubular about said chamber axis.

11. The analyzer of claim 1, wherein said gap has a substantially constant thickness.

12. The analyzer of claim 1, wherein said first and second grids are substantially flat.

13. The analyzer of claim 1, which is an electron analyzer, wherein said electrode is biased negatively with respect to said curved electrode and said second grid is biased negatively with respect to both said first grid and said electrode.

14. The analyzer of claim 1, which is an electron analyzer, wherein said electrode is composed of electrode parts biased negatively with respect to said curved electrode and differentially biased between said electrode parts and said second grid is biased negatively with respect to said first grid and said electrode parts.

15. A charged particle analyzer, comprising:

a reflector comprising a first grid and at least one electrode positioned on a back side of said first grid and separated therefrom by a gap, a source of charged particles being positioned on a front side of said first grid;

a conductive sidewall extending along and surrounding a chamber axis and held at a same potential as said first grid;

a second grid arranged substantially transversely to said chamber axis and held at the same potential as said first grid and having a front side facing said first grid along said chamber axis, wherein said first and second grids are shaped such that charged particles emanating from said source and reflected by said first grid are incident upon said second grid at substantially normal angles;

a third grid arranged on a back side of said second grid; and a charged particle detector positioned on a side of said third grid opposite said first grid.

16. The analyzer of claim 15, wherein said second grid is substantially flat.

17. The analyzer of claim 16, wherein said first grid is ellipsoidally shaped.

18. The analyzer of claim 15, wherein said reflector is capable of producing from charged particles received from said source a beam of said charged particles that is substantially collimated along a chamber axis.

19. The analyzer of claim 15, wherein said first grid is flat.

20. An electron particle analyzer, comprising:

an electron source emitting electrons emitting in a beam angularly dispersed about a first axis;

a vacuum chamber extending along a second axis substantially transverse to said first axis;

an ellipsodially shaped first grid disposed to reflect electrons received from said electron source in a collimated beam along said second axis;

an electrode disposed on said first grid opposite said electron source and differentially biased with respect to said first grid such that said first grid and said electrode act as a low-pass reflector;

a second grid extending transversely to said second axis and electrically connected to said first grid;

a third grid position extending at least partially transversely to said second axis and biased with respect to said first grid to act as a high-pass transmissive filter; and an electron detector positioned on a side of said third grid opposite said second grid.

21. An X-ray photoelectron spectrometer, comprising:

a vacuum chamber generally aligned along a first axis;

a source of X-rays exterior to said vacuum chamber to irradiate a sample to produce a beam of electrons along a second axis oblique to said first axis;

a vacuum window in said vacuum chamber passing said electrons therethrough;

a reflector disposed at an intersection of said first and second axes and comprising a curved grid and at least one curved electrode positioned on a back side of said curved grid and separated therefrom by a gap;

a conductive sidewall extending along and surrounding said second axis and held at a same potential as said curved grid;

a first grid arranged substantially transversely to said first axis and held at the same potential as said curved grid and having a front side facing said curved grid along said first axis;

a second grid arranged on a back side of said first grid; and an electron detector positioned on a side of said second grid opposite said first grid.

22. The spectrometer of claim 21, wherein said curved grid is ellipsoidally shaped.

23. The spectrometer of claim 21, wherein said reflector acts as a low-pass reflective filter and said first and second grids act as a high-pass transmissive filter.

* * * * *